(12) United States Patent
Takagi

(10) Patent No.: US 6,226,504 B1
(45) Date of Patent: May 1, 2001

(54) RECEIVING APPARATUS

(75) Inventor: Kotaro Takagi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/179,338

(22) Filed: Oct. 27, 1998

(30) Foreign Application Priority Data

Oct. 31, 1997 (JP) .................................................. 9-301326

(51) Int. Cl.$^7$ .................................................. H04B 1/16
(52) U.S. Cl. .................................. 455/234.1; 455/240.1; 455/241.1; 455/249.1
(58) Field of Search .............................. 455/241.1, 245.2, 455/250.1, 253.2, 234.1, 234.2, 251.1; 330/129, 135, 136, 278, 279

(56) References Cited

U.S. PATENT DOCUMENTS 4,030,035 * 6/1977 Ienaka et al. .................. 455/245.2
5,930,693 * 7/1999 Kenedy et al. ................. 455/234.1
5,940,143 8/1999 Igarashi et al. .................. 348/678

FOREIGN PATENT DOCUMENTS 0 797 299   9/1997  (EP) ................................ H03G/3/30

* cited by examiner

*Primary Examiner*—Lee Nguyen
(74) *Attorney, Agent, or Firm*—Limbach & Limbach L.L.P.; Seong-Kun Oh

(57) ABSTRACT

A receiving apparatus is disclosed which can cope with the fluctuation of input level of RF signal appropriately and has a first amplifier means wherein the amplifying and the attenuating of input signal are selectively performed and for processing the signal in a communication band handled by this apparatus, and a second amplifier means for gain-variably amplifying a signal, which is a signal converted from the output of the first amplification means 13 into the intermediate frequency signal or base band signal, the gain of the second amplifier means being set based on the detection of output level of the second amplifier means, and the selection of the amplification or attenuation in the first amplifier means, (13) being performed based on the detection level of output from the first amplifier means.

96 Claims, 7 Drawing Sheets

RECEIVING APPARATUS

BACKGROUND OF THE INVENTION

1. Field of the Invention

The present invention relates to a receiving apparatus and method for receiving a high frequency signal suitable for use in various kinds of wireless appliances which perform the digital signal processing in, for example, base band at a high degree, and more particularly, to a technique for controlling the gain of a received signal.

2. Description of the Related Art

In a receiving apparatus for receiving and processing a ratio signal and so on, a gain-variable amplifier for amplifying an input signal in a gain variable fashion is provided in a receiving circuit system in order to keep the input level of a receiving signal at a constant level, and an automatic gain control circuit (AGC circuit) for controlling the gain of the amplifier corresponding to the level of input signal is incorporated thereinto.

Particularly, in case of a communication appliance for receiving digital data, it is very important to control a receiving signal level appropriately, because if the input level of an analog/digital converter for converting the received signal into digital data is not appropriately controlled, the analog/digital converter can not perform the digital conversion appropriately.

Meanwhile, if an amplifier for amplifying a high frequency input signal (RF signal) is as gain-variable, for example, is composed of a most general bipolar transistor, it is difficult to perform the gain-controlling successively, while maintaining the linearity of amplification characteristic of the amplifier itself. Further, since the AGC circuit is such a circuit as to apply a feedback in an analog manner, there exists a problem that it takes time for the system to converge to a stable state for a sudden variation of the input level.

In another manner using a gain-variable amplifier for controlling the gain successively, a circuit may be incorporated which performs the process of cutting a bias current of an RF amplifier using a non-linear element (so called shunt process) when a strong input having a level higher than a certain signal level is received, to thereby prevent an amplification from being performed in the amplifier. The case of such a circuit, the linearity of signal is excellent in any case because the amplification in the amplifier element is not performed at a time of a strong input.

However, the case that an RF amplifier for performing such a shunt process is incorporated into a prior art receiving circuit, it is necessary to detect the input level at the front stage of the RF amplifier to be shunted in order to cope with such a condition that when the input level decreases, while the RF amplifier does not perform the amplification due to the detection of a strong input, and therefore, an amplifier for amplifying the input signal and a detecting circuit for detecting the amplified output thereof are necessary in parallel to the RF amplifier to be shunted, resulting in a problem that the control arrangement becomes very complicated. Moreover, there exists a problem that if the shunt process is performed in such an RF amplifier, the input level may change sharply and therefore the receiving system becomes unstable due to the level fluctuation just after such a shunt process.

SUMMARY OF THE INVENTION

In a view of the above problem, an object of the present invention is to provide a receiving apparatus which can cope with the fluctuation of input level of an RF signal appropriately.

According to an aspect of the present invention, there is provided a receiving apparatus for receiving a desired channel signal in a predetermined communication band, which comprises a first amplifier means for selectively carrying out an amplification and an attenuation of an input signal and for handling a signal in said communication band;

a converter means for converting said channel signal outputted from said first amplifier means into an intermediate frequency signal or a base band signal;

a second amplifier means for amplifying a signal converted by said converter means in a gain variable fashion, a level detecting means for detecting a signal level of a receiving channel by detecting an output level of said second amplifier means;

a gain setting means for a setting a gain of said second amplifier means based on a detected output of said level detecting means;

a detector means for detecting said input signal level by detecting an output of said first amplifier means; and a control means for selecting the amplification or the attenuation in said first amplifier means based on a detection output of said detector means.

DESCRIPTION OF THE PREFERRED EMBODIMENTS

Hereinafter, an embodiment of the present invention will be described with reference to the accompanying drawings. A first embodiment of the present invention is described with reference to FIG. 1~FIG. 5.

In the present embodiment, the present invention is adapted to a receiving unit of a communication appliance for receiving and processing a signal which is modulated to a high frequency signal (RF signal) to be wirelessly transmitted in a channel (this channel is set at a certain frequency interval in a communication band, for example) set in a pre-allocated communication band of a predetermined frequency (for example, several GHz band), the transmitted data being such digital data as modulated in a predetermined system.

Figure 1:
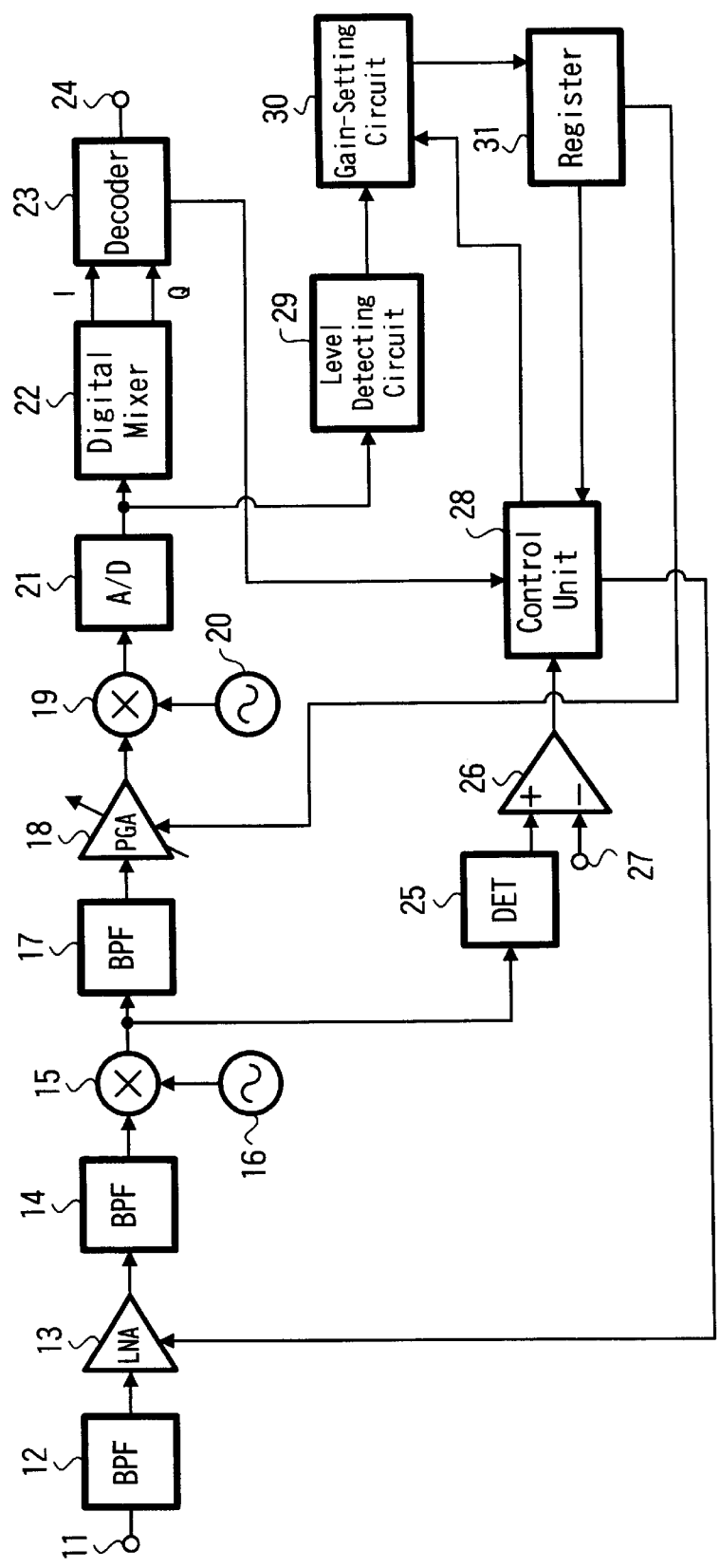
FIG. 1 is a block diagram showing an arrangement of a receiving apparatus according to a first embodiment of the present invention.

FIG. 1 shows an arrangement of a receiving system according to the present embodiment, in which a high frequency signal received by an antenna is obtained at an input terminal 11 and the signal obtained at the input terminal 11 is supplied to a low-noise amplifier (LNA) 13 via a band-pass filter (BPF) 12. Here, this band-pass filter 12 is such a filter as to allow the communication band signal received by this apparatus to pass, but to remove any high frequency band signals other than such band signal.

The low-noise amplifier 13 is such a low-noise amplifier of a non-linear characteristic which uses a silicon-bipolar transistor and whose power supply for amplification is controlled by a control unit 28, which will be described later. In the state that the power supply for amplification is applied to the low-noise amplifier 13, the input signal is amplified by a predetermined amount (+10 dB in this example) and then outputted, while in the state that the power supply for amplification is not applied thereto, the input signal is attenuated by a predetermined amount (−20 dB in this example) and then outputted.

Figure 2:
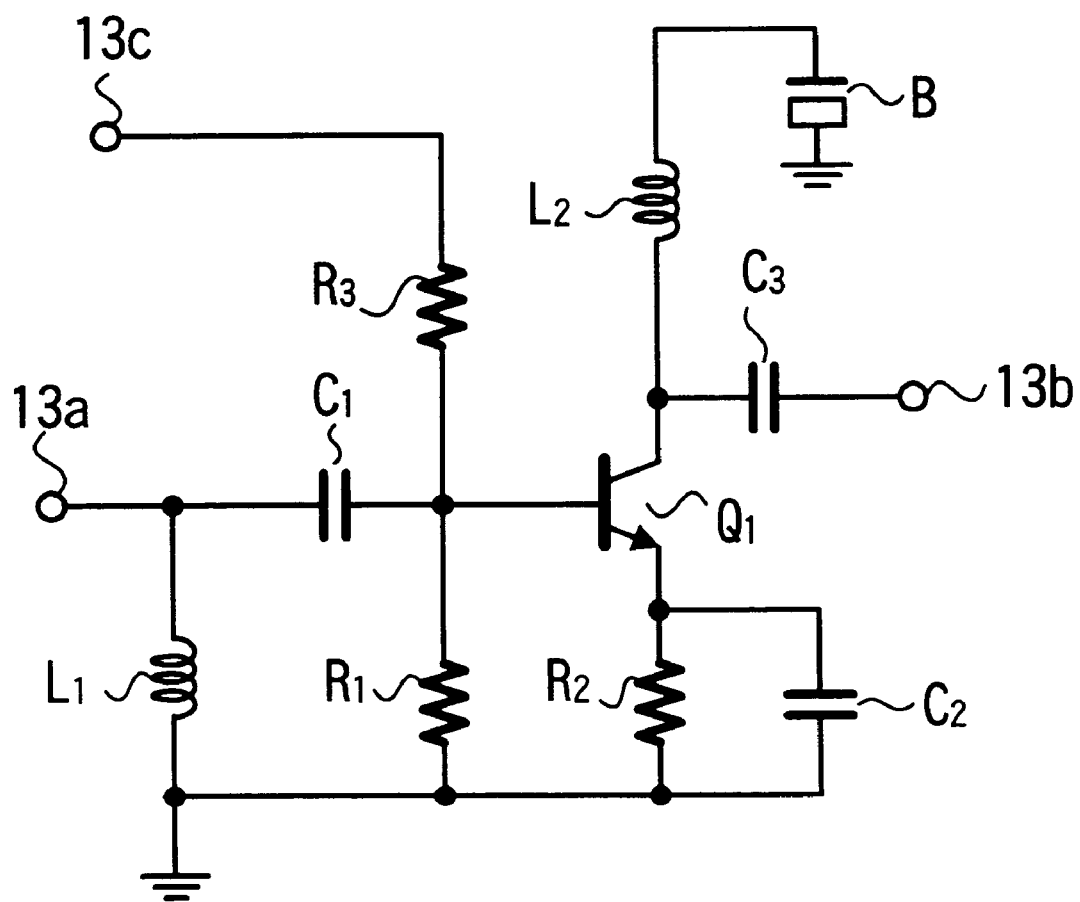
FIG. 2 is a circuit diagram showing an example of the arrangement of a low-noise amplifier according to the first embodiment of the present invention.

In the meanwhile, an example of an arrangement of low-noise amplifier 13 is shown in FIG. 2 in which a signal obtained at an input terminal 13a is supplied to the base of an NPN-type bipolar transistor $Q_1$ via a capacitor $C_1$. As this transistor $Q_1$, an element having a non-linear amplification characteristic is used. The base of transistor $Q_1$, is connected to the ground via a resistor $R_1$ and the input terminal 13a side is also connected to the ground via a coil $L_1$. The emitter of transistor $Q_1$ is connected to the ground via a parallel circuit consisting of a resistor $R_2$ and a capacitor $C_2$. The signal obtained at the collector of transistor $Q_1$ is delivered to an output terminal 13b via a capacitor $C_3$.

Further, a power supply terminal 13c to which a base-bias signal as a power supply for operating this amplifier is supplied from the control unit 28 is connected to the base of transistor $Q_1$, via a resistor $R_3$. A power supply voltage $V_{CC}$ from a power supply circuit B is applied to a coil $L_2$ to generate a predetermined current, which is supplied to the collector of transistor $Q_1$.

By employing the circuit arrangement as shown in FIG. 2, when a predetermined voltage signal is supplied from the control unit 28 to the power supply terminal 13c, the voltage divided by the resistors $R_1,R_3$ becomes the base voltage of transistor $Q_1$ and hence the transistor $Q_1$ turns to the on-state to thereby supply the collector current from the power supply circuit B via the coil $L_2$ thereto. Thus, the high frequency signal obtained at the input terminal side is amplified and outputted from the output terminal 13b.

When the voltage of signal supplied from the control unit 28 to the power supply terminal 13c becomes low and the transistor $Q_1$ turns to the off-state, the collector current is not supplied thereto and hence the amplification by the transistor $Q_1$ is not performed. At this time, if the frequency of high frequency signal obtained at the input terminal 13a is in a frequency band of a relatively high, for example, several GHz, the signal flow is not completely interupted by the transmitter $Q_1$ even if the transistor $Q_1$ is in the off-state. Thus, the high frequency signal obtained at the input terminal 13a is attenuated and then transmitted to the output terminal 13b. Accordingly, if the transistor $Q_1$ is made to be in the off-state by the signal obtained at the power supply terminal 13c, the circuit shown in FIG. 2 acts as an attenuator having a predetermined attenuation amount.

Turning back to the description on the circuit in which the above described low-noise amplifier 13 is incorporated, as shown in FIG. 1, the output of low-noise amplifier 13 is supplied to a mixer 15 via a band-pass filter 14. The band-pass filter 14 is such a filter as to allow the communication band signal received by this apparatus to pass, but to remove any high frequency signals other than such band signal, similarly to the band-pass filter 12 disposed at the front stage of low-noise amplifier 13.

The mixer 15 is such a circuit as to mix the high frequency signal supplied from the band-pass filter 14 and an oscillation output from a first intermediate frequency signal oscillator 16 to generate a first intermediate frequency signal. The receiving channel of the receiving apparatus is determined by the oscillation frequency of the first intermediate frequency signal oscillator 16. The first intermediate frequency signal outputted by the mixer 15 is supplied to a program-gain amplifier (PGA) 18 via a band-pass filter 17. The band-pass filter 17 is a filter that has a characteristic to allow the first intermediate frequency signal of one transmission channel band to pass. The program-gain amplifier 18 is such a variable-gain amplifier whose gain is set by a gain-setting signal supplied thereto from a gain-setting circuit 30 via a register 31, and a so-called automatic-gain control loop (hereinafter, it is referred to as an AGC loop) in which the gain is set based on the output level of this amplifier 18 is formed. In the present embodiment, the program-gain amplifier 18 is configured to vary the gain thereof between −20 dB and +60 dB.

The amplified output of program-gain amplifier 18 is supplied to a mixer 19, which mixes the output of amplifier 18 with an oscillation output of a second intermediate frequency signal oscillator 20 to produce a second intermediate frequency signal. The second intermediate frequency signal outputted from the mixer 19 is supplied to an analog/digital converter 21. In the analog/digital converter 21, digital data is produced by sampling the supplied signal and the digital data is supplied to a digital mixer 22 to be separated into an I component and a Q component. Then, the separated I and Q components are supplied to a decoder 23 to be subjected to predetermined decoding processing to produce decoded receiving data, which is supplied from an output terminal 24 to a receiving data processing system at the rear stage. In the decoder 23 according to the present embodiment, the error rate of the received data decoded is judged by a predetermined method (for example, judged by the number of eraser corrections), and the judged result is supplied to the control unit 28. Further, the analog/digital converter 21 according to the present embodiment is a circuit which can perform an appropriate digital conversion when the input signal level is −5 dBm.

In the arrangement of the ACG loop for setting the gain of program-gain amplifier 18, the converted output of analog/digital converter 21 is judged by a level detecting circuit 29 and the gain-setting circuit 30 supplies a gain-setting signal to the program-gain amplifier 18 such that the judged level becomes an appropriate state. In this embodiment, the gain-setting signal outputted from the gain-setting circuit 30 is held by the register 31, which supplies the held gain-setting signal to the control unit 28, as well. Since the level detecting circuit 29 judges the signal level from the digital-converted second intermediate frequency signal after passing the receiving channel signal only through the band-pass filter 17, the level of only the receiving channel signal (the level of a desired wave including no jamming waves) is judged.

An arrangement for selecting the amplification process or the attenuation process in the low-noise amplifier 13 will be described hereinafter. The first intermediate frequency signal outputted from the mixer 15 is supplied to a detecting circuit 25, which detects the level thereof as a DC level and supplies the detection signal to the plus side input terminal of a comparator 26. A reference signal obtained at a reference signal input terminal 27 is supplied to the minus side input terminal of the comparator 26, which compares the output level of the mixer 15 with the level determined by the reference signal and supplies the comparing result (judge result of whether the level is above the reference level or not) to the control unit 28. Since the judgement by the comparator 26 is carried out on the basis of signal in the communication band passing through the band-pass filters 12,14, the receiving level in the whole communication band is judged. If there exist any jamming waves other than a desired receiving channel signal, the level of receiving signal including the jamming waves is judged. In the control unit 28, the supplied compared result, the gain-setting signal for the program-gain amplifier 18 supplied from the register 31 and the error rate value supplied from the decoder 23 are judged to determine the process by the low-noise amplifier 13 to be either one of the amplification process or the attenuation process and to control the state thereof to be that process.

Figure 5:
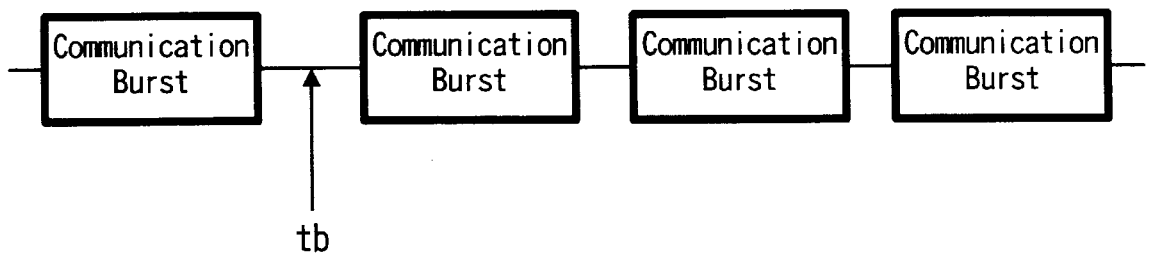
FIG. 5 is an explanation diagram showing another example of process timing according to the first embodiment of the present invention.

In the present embodiment, the change-over between the amplification process and the attenuation process in the low-noise amplifier 13 under the control of the control unit 28 is carried out at a timing other than the receiving period. Specifically, a communication state which is performed by the apparatus according to the present embodiment is such that, at a communication state such as a TDMA system wherein the receiving process of a receiving slot RX and the transmitting process of a transmitting slot TX are performed intermittently, as, for example, shown in FIG. 4 where the abscissa represents a time, the change-over between the amplification process and the attenuation process in the low-noise amplifier 13 is performed at a timing "ta" when at least the receiving process of the receiving slot RX is not performed (preferably this timing "ta" is the timing when the transmitting process is not performed). Further, as shown in FIG. 5, if a communication burst of a predetermined time width is set periodically and at each communication burst the transmitting process and the receiving process are performed (if the apparatus performs only the receiving process, the receiving process is performed), the change-over between the amplification process and the attenuation process in the low-noise amplifier 13 is performed at a timing "tb" in the synchronizing period between the respective communication bursts.

According to the present embodiment, when the state of the low-noise amplifier 13 is changed over, the corresponding control signal is supplied from the control unit 28 to the gain-setting circuit 30 to vary the gain of the program-gain amplifier 18 by such an amount as to compensate for the level fluctuation in order to compensate for the level fluctuation of the second intermediate frequency signal which is caused upon the changing-over.

The control process of the low-noise amplifier 13 by the control unit 28 and the gain-setting process of the program-gain amplifier 18 in association with this control process of the low-noise amplifier 13 are described with reference to the flow chart of FIG. 3. The process according to the present embodiment is performed in order to make the input level to the analog/digital converter 21 to be a suitable level (−5 dBm in this embodiment).

First, when the signal receiving is started by the receiving apparatus according to the present embodiment, a state is set such that the amplification process is performed by the low-noise amplifier 13 under the control of the control unit 28 (step 101). Then, an "I" bit which is a flag for detecting a jamming wave is set in the control unit 28 is set to zero (step 102). Next, the control unit 28 judges the comparing output of the comparator 26 and judges whether it is above the reference level or not (step 103). If it is less than the reference level, the state of the low-noise amplifier 13 is maintained as it is (in other words, the amplification process is continued) and the gain control process by the AGC loop is performed in order to make the input level to the analog/digital converter 21 a suitable level by the gain-setting of the program-gain amplifier 18 under the control of the gain-setting circuit 30 based on the level judged by the level detecting circuit 29.

If it is judged to be more than the reference level at step 103, the receiving state is judged as a strong input state and the control unit 28 judges the gain-setting signal which is held in the register 31 (the gain set in the amplifier 18 at present) to judge whether the setting gain (amplification factor) exceeds a predetermined reference level th1 or not (step 104). In this case, the reference level th1 is a reference level for detecting that the setting level is too high when the low-noise amplifier 13 is set at the amplification state (that is, if the gain is set to more than the reference level, the signal may be distorted because the gain is too high). If the gain set in the program-gain amplifier 18 is higher than the reference level th1, the I bit which is a flag for detecting the jamming wave is set to "1" (step 105).

In the case that the I bit is set to 1 and in the case that the gain is judged to be less than the reference level th1, the incremental process is performed such that a value n of the register prepared in the control unit 28 is added by one (step 106). After this incremental process, the control unit 28 judges the value n held in the register to judge whether it is less than a predetermined regular value or not (step 107). If it is judged that the value of n has become the predetermined regular value within a relatively short period of time (this regular value is a predetermined integer value more than "2"), a timer is set in the control unit 28 and the low-noise amplifier 13 will be maintained at the present state (in this case, the amplification state) until the timer counts up an elapse of a predetermined time (for example, elapse of several ten seconds to several minutes)(step 108). After the timer is set, the value n stored in the register within the control unit 28 is reset to 0 (step 109), and the process returns to the setting process of I bit at step 102.

If it is judged that n is less than the regular value at step 107, it is judged whether the present communication timing is a signal receiving period or not (step 110). If it is the signal receiving period, the process waits at this step. At the timing of no signal receiving period, the state of the low-noise amplifier 13 is changed over from the amplification state to the attenuation state under the control of the control unit 28 (step 111). When the state of the low-noise amplifier 13 is changed over, such a process that the gain of program-gain amplifier 18 is increased by an amount of the level fluctuation of the second intermediate frequency signal due to this change of state is performed immediately (step 112). To be concrete, if it is assumed that the gain of program-gain amplifier 18 is Gpga, the gain of low-noise amplifier 13 at amplification state is Glna and the insertion loss of low-noise amplifier 13 at the attenuation state is Llna, a process for updating the gain Gpga of program-gain amplifier 18 is performed as shown by the following equation (1).

$$Gpga=Gpga+(Llna+Glna) \quad (1)$$

After the gain of program-gain amplifier 18 has been changed, it waits for a while until the AGC loop becomes stable (step 113) and then the value of I bit which is a flag for detecting the jamming wave is judged(step 114). If the value of I bit is 0, it is judged that the possibility of a desired wave being received is high and the control unit 28 judges the gain-setting signal of program-gain amplifier 18 to judge whether the set gain (amplification factor) exceeds a predetermined reference level th2 or not (step 115). In this case, the reference level th2 is a reference level for detecting that the set gain is too high when the low-noise amplifier 13 is set at the attenuation state (that is, if the gain is set to more than the reference level, a signal may be distorted because the gain is too high). If the gain set in the program-gain amplifier 18 is lower than the reference level th2, the signal receiving process is continued under the gain-control of the AGC loop.

If it is judged that the gain became more than the reference level th2 at step 115, it is judged whether the present communication timing is the signal receiving period or not (step 116), and if it is in the signal receiving period, it waits at this step. At a timing when the communication timing comes to no signal receiving period, the low-noise amplifier 13 is changed over from the attenuation state to the amplification state under the control of the control unit 28 (step 117). If the state of the low-noise amplifier 13 is changed over, such a process that the gain of program-gain amplifier 18 is decreased by an amount of the level fluctuation of the second intermediate frequency signal due to this change of state is performed immediately (step 118). To be concrete, if it is assumed that the gain of program-gain amplifier 18 is Gpga, the insertion loss of low-noise amplifier 13 at the amplification state is Glna and the insertion loss of low-noise amplifier 13 at the attenuation state is Llna, a process for updating the gain Gpga of program-gain amplifier 18 is performed as shown by the following equation (2).

$$Gpga=Gpga-(Llna+Glna) \qquad (2)$$

After the gain of program-gain amplifier 18 has been changed and it has waited for a while until the AGC loop becomes stable (step 119), it returns to the process of setting the I bit at step 102.

In the case that it is judged that the value of I bit is 1 at step 114, it is judged that the possibility of the jamming wave being received is high and the control unit 28 judges the comparing output of the comparator 26 to judge whether it is more than the reference level or not (step 120). If it is judged that it is less than the reference level and therefore the level of jamming waves became lower, the process shifts to step 116 at which the state of low-noise amplifier 13 is turned into the amplification state at a timing of signal receiving period. If it is judged at step 120 that it is more than the reference level and it is worse than a predetermined regular error rate, it is determined by judging from the error rate resulting from the decoding of the receiving data that it is impossible to receive a signal in a good condition and the process shifts to step 116 at which the state of low-noise amplifier 13 is turned into the amplification state at a timing of no signal receiving period.

As described above, by controlling the state of low-noise amplifier 13 and the gain of program-gain amplifier 18, the distortion of receiving signal by the program-gain amplifier 18 and the mixers 15,19 at a strong input state where the jamming wave may be received at a high level can be avoided. In other words, in case of a strong input state due to the high level of desired waves, the attenuation process is performed by the low-noise amplifier 13 and the signal with an appropriate level is supplied to the system following the program-gain amplifier 18 and processed resulting in an excellent signal receiving process. In the case of a strong input state where the level of the jamming wave is high, the low-noise amplifier 13 is turned into the amplification state only when the attenuation process is performed in the low-noise amplifier 13 and the signal receiving state can not be maintained at a good condition, resulting in an excellent signal receiving being possible even though the jamming wave is at a high level.

Figure 3:
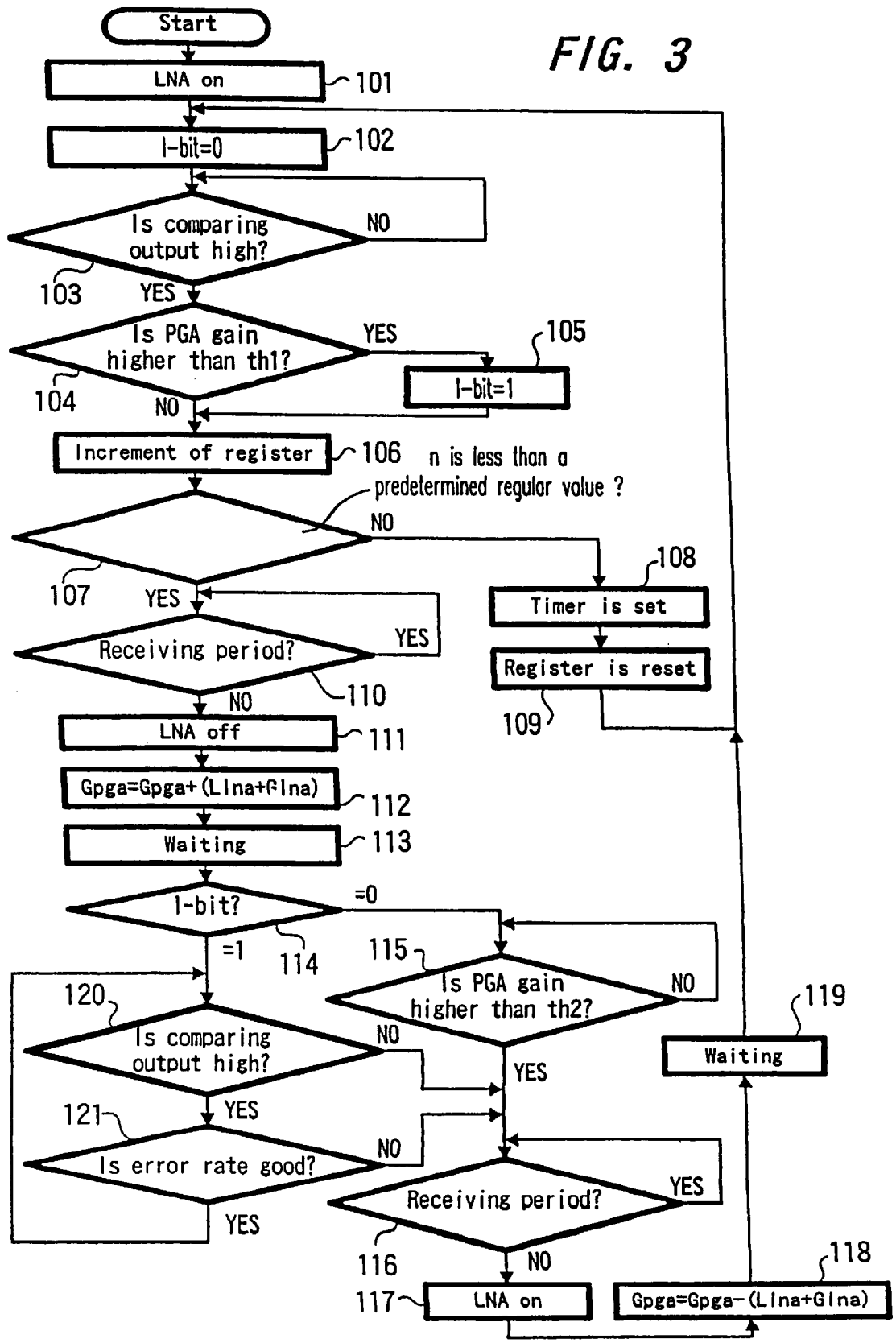
FIG. 3 is a flow chart showing a gain control process according to the first embodiment of the present invention.
Figure 4:
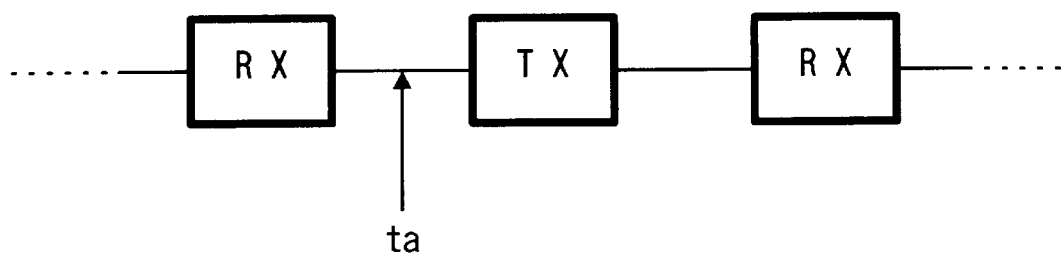
FIG. 4 is an explanation diagram showing an example of process timing according to the first embodiment of the present invention.

In this case, according to the present embodiment, by performing the process shown in the flow chart of FIG. 3, it is not necessary to provide processes or circuits for performing the detection of strong input due to the desired wave and therefore, the signal receiving arrangement can be simplified by the that extent.

In case of the present embodiment, since the process for judging the level of desired waves in the control unit 28 is performed on the basis of the gain-setting signal of the program-gain amplifier 18, it is not necessary to perform a process for judging the level of desired wave separately and hence, it can achieve a high processing rate.

Further, according to the present embodiment, when the low-noise amplifier 13 is changed over between the amplification state and the attenuation state, the amplification factor of program-gain amplifier 18 is changed by a corresponding amount. Thus, a sudden level fluctuation immediately after the changing-over of the state of low-noise amplifier 13 can be suppressed and the time period from the changing-over of the state of low-noise amplifier 13 to the signal receiving system becoming stable can be shortened remarkably. Further, according to the present embodiment, the process for changing over the low-noise amplifier 13 between the amplification state and the attenuation state is performed at a timing other than the signal receiving period, so that it is possible to avoid the deterioration of signal receiving state due to temporary fluctuations of received intermediate frequency signal level.

Moreover, as shown in step 108 in the flow chart of FIG. 3, if the change-over of the state of the low-noise amplifier 13 is performed relatively frequently, the timer is set so as to fix the state of low-noise amplifier 13 for a predetermined period of time (in this embodiment, the amplification state is maintained) in order to prevent the signal receiving state from becoming unstable due to frequent changes of the state of low-noise amplifier 13.

Figure 6:
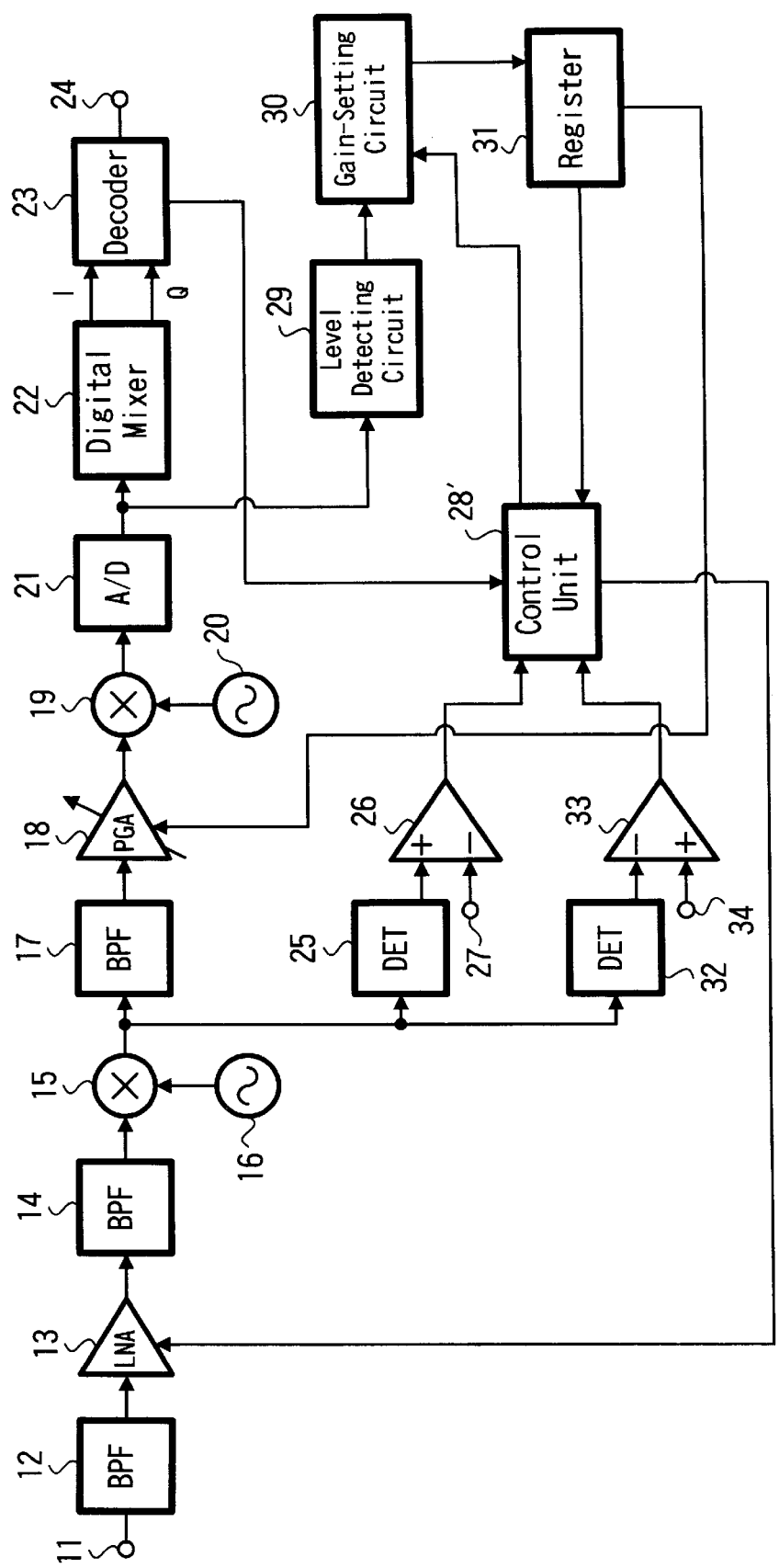
FIG. 6 is a block diagram showing an arrangement of the receiving apparatus according to a second embodiment of the present invention.

Next, a second embodiment according to the present invention will be described with reference to FIG. 6. In FIG. 6, the parts corresponding to the parts of the first embodiment described with reference to FIG. 1 are designated by the same reference numerals and the detailed description thereof will be omitted.

According to the second embodiment, there are provided two detecting circuits and two comparing circuits for judging the level of first intermediate frequency signal, and the comparison between the reference level and the level of first intermediate frequency signal is judged with a hysteresis. That is, the first intermediate frequency signal outputted from the mixer 15 is supplied to the detecting circuit 25 which detects the level thereof as a DC level, and the detection signal thereof is supplied to the plus side input terminal of the comparator 26. To the minus side input terminal of the comparator 26, the reference signal which is obtained at the reference signal input terminal 27 is supplied to thereby compare the output level of the mixer 15 with the level which is determined by the reference signal. Then, the result of comparison (the judging result of whether it is above or below the reference level) is supplied to a control unit 28'. The first intermediate frequency signal outputted from the mixer 15 is also supplied to a detecting circuit 32, which detects the level thereof as a DC level and the detection signal is supplied to the minus side input terminal of a comparator 33. To the plus side input terminal of the comparator 33, a reference signal which is obtained at a reference signal input terminal 34 is supplied to thereby compare the output level of the mixer 15 with the level which is set by the reference signal and then the result of comparison (the judged result of whether it is above or below the reference level) is supplied to the control unit 28'. In this case, the levels of reference signals obtained at the input terminals 27,34 are set to be different levels with each other.

In the control unit 28', the judgment whether the signal receiving level becomes higher than the reference level or not is performed based on the comparing output of comparator 26, while the judgment whether the signal receiving level becomes lower than the reference level or not is performed based on the comparing output of comparator 33. The other control processes in the control unit 28' are the same as those in the control unit 28 which were described with reference to the first embodiment of the present invention. The arrangement of other parts in FIG. 6 which are designated by the same reference symbols as FIG. 1 are of the same arrangement as the first embodiment of the present invention, and the signal receiving processes thereof are performed in the same manner as shown in the flow chart of FIG. 3.

By such an arrangement, the judgment of the signal receiving level has a hysteresis and it results in an excellent judgment.

Figure 7:
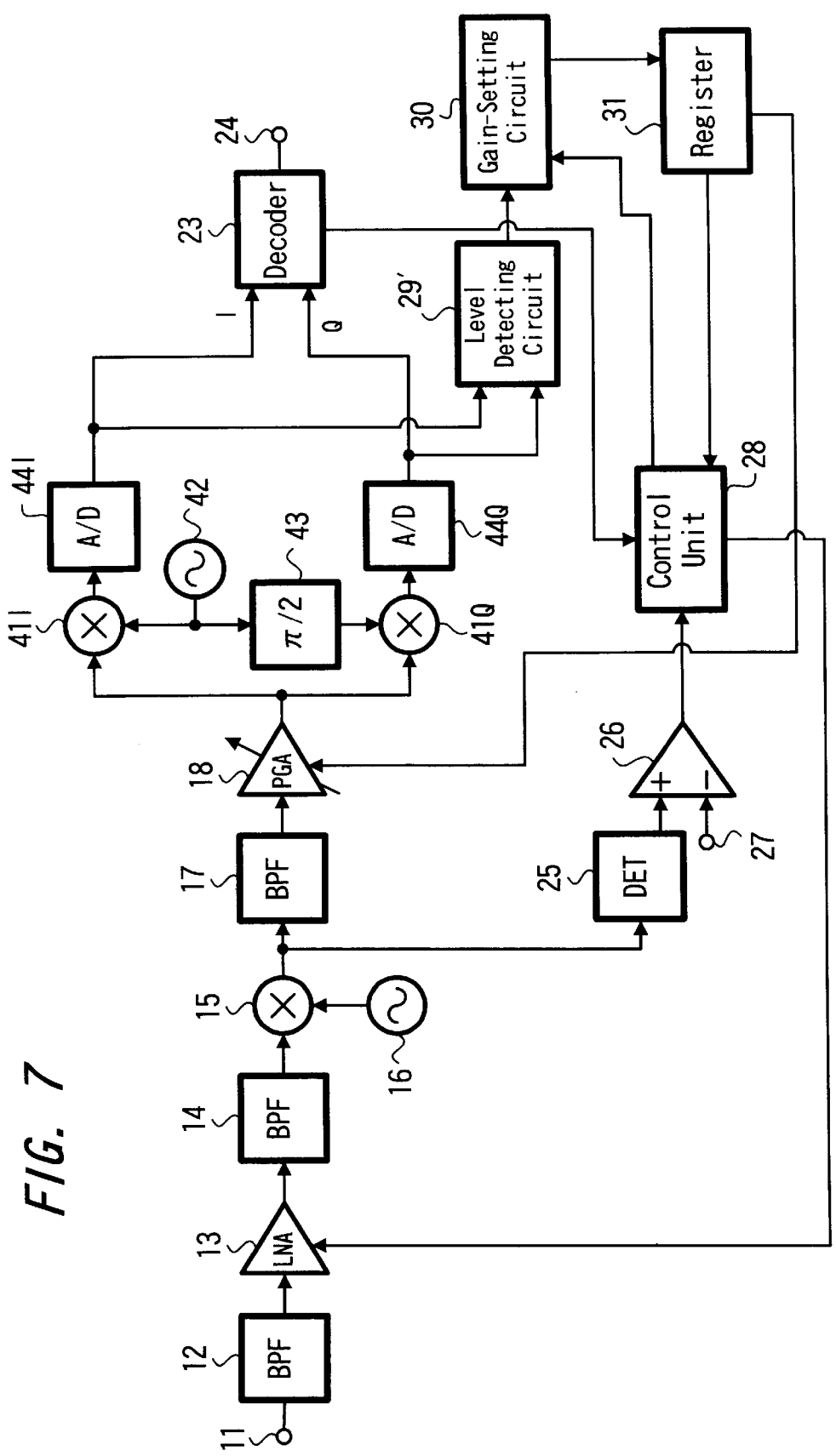
FIG. 7 is a block diagram showing an arrangement of the receiving apparatus according to a third embodiment of the present invention.

A third embodiment of the present invention will be described hereinafter with reference to FIG. 7. In FIG. 7, the parts corresponding to the parts of the first embodiment described with reference to FIG. 1 are designated by the same reference numerals and the detail description thereof will be omitted.

In the third embodiment, the process arrangement for obtaining data of the I component and data of the Q component from the intermediate frequency signal is made different from that of the first embodiment. To be concrete, the first intermediate frequency signal outputted from the program-gain amplifier 18 is supplied to two mixers 41I, 41Q. An oscillating output of an oscillator 42 for I/Q demodulation is supplied to the mixer 41I directly, while the oscillating output of the oscillator 42 for I/Q demodulation is supplied to the mixer 41Q with a phase shift of π/2 by a π/2 phase-shifter 43. The base band signal outputted from the mixer 41I is supplied to an analog/digital converter 44I to derive digital data of I component. The base band signal outputted from the mixer 41Q is supplied to an analog/digital converter 44Q to derive digital data of Q component. The date of I component and the data of Q component thus obtained are supplied to the decoder 23 which performs the decoding process for the both data.

The output data of the two analog/digital converters 44I,44Q are supplied to a level detecting circuit 29' which judges the level based on both the output data and supplies the judging result to the gain-setting circuit 30. The arrangements of the other parts are the same as those of the first embodiment and the signal receiving processes thereof are also the same as those of flow chart in FIG. 3.

As shown in the third embodiment, even if the I component and the Q component are converted by the two different analog/digital converters respectively, the same signal receiving process as the first embodiment can be achieved and the same effect can be obtained. Moreover, even in the case that the I component and the Q component are converted by the two different analog/digital converters as shown in the third embodiment, the judgment of the signal receiving level may have a hysteresis as described in the second embodiment.

Figure 8:
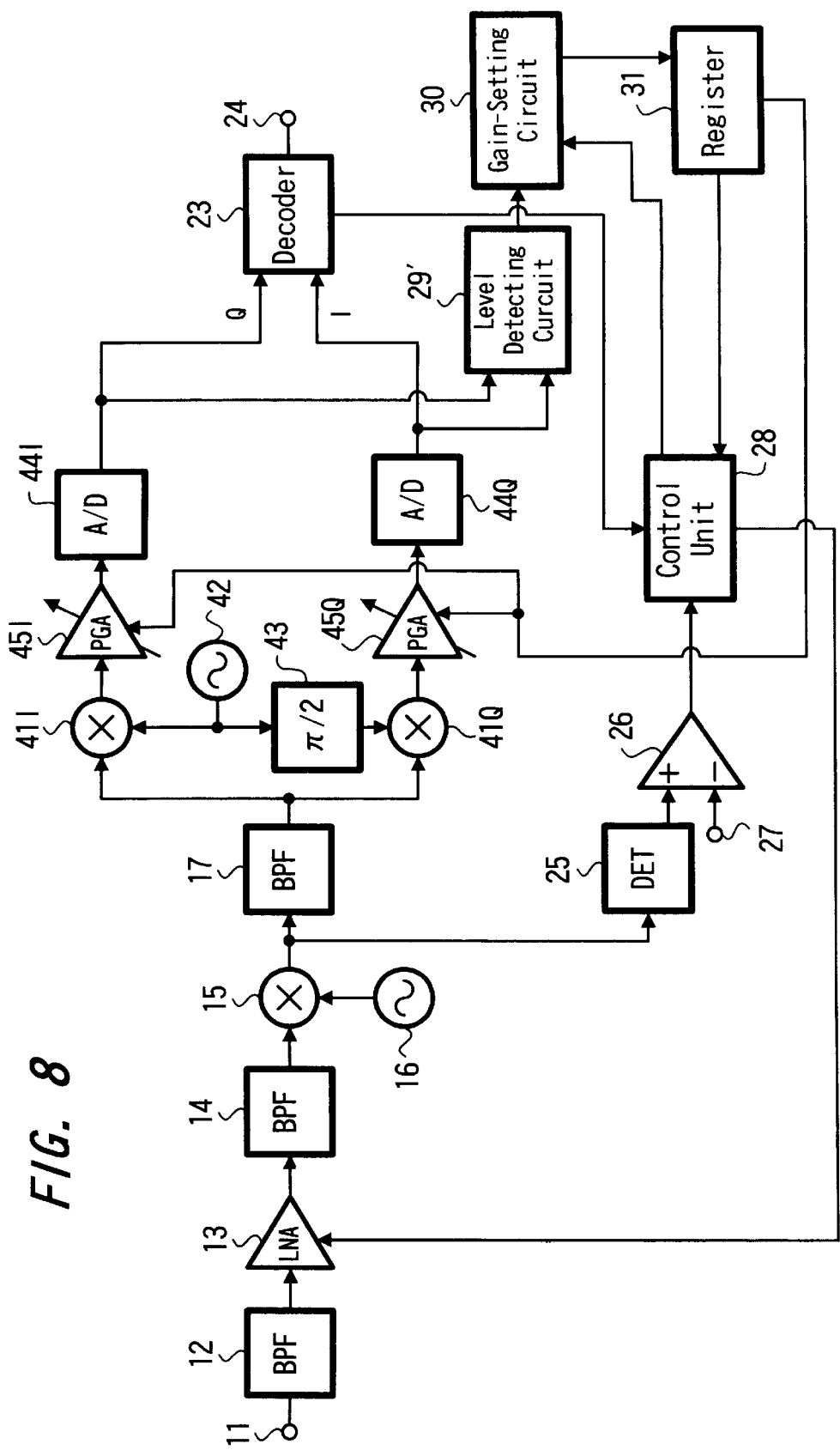
FIG. 8 is a block diagram showing an arrangement of the receiving apparatus according to a fourth embodiment of the present invention.

A fourth embodiment of the present invention will be described hereinafter with reference to FIG. 8. In FIG. 8, the parts corresponding to the same parts described in the first and third embodiments shown in FIGS. 1 and 7 are designated by the same reference numerals and the detail description thereof will be omitted.

According to the fourth embodiment, when the I component and the Q component data obtained by the signal reception are processed by the two separate mixers 41I,41Q similarly to the third embodiment, program-gain amplifiers are connected to the rear-stage of the mixers 41I,41Q, respectively. Specifically, the output of the mixer 41I is supplied to a program-gain amplifier 45I and the amplified output of the program-gain amplifier 45I is supplied to the analog/digital converter 44I. Similarly, the output of the mixer 41Q is supplied to a program-gain amplifier 45Q and the amplified output of the program-gain amplifier 45Q is supplied to the analog/digital converter 44Q. The gains of the respective program-gain amplifiers 45I,45Q are controlled to be the same gain by a common gain setting signal which is supplied thereto from the gain-setting circuit 30 via the register 31. However, the gains may be controlled separately based on the detecting levels of I component and Q component, respectively. The arrangement of other parts are the same as those of the third embodiment and the signal receiving processes thereof are the same as those of the flow chart of FIG. 3.

As shown by the fourth embodiment, even if the I component and the Q component are separately amplified, an excellent signal receiving process can be achieved similarly to the other embodiments.

The arrangement of the low-noise amplifier which acts as an amplifier for being changed over between the amplification state and the attenuation state described with reference to the first embodiment is only an example, and therefore the low-noise amplifier is not limited to this arrangement.

According to a first aspect of the present invention, since a strong input period is coped by the selection between the amplification and the attenuation of RF input signal in the first amplifier means and the continuous level control is performed by the gain-variable amplification in the second amplifier means, the input level of RF signal can be processed at a good condition successively from the strong input state to the weak input state.

According to a second aspect of the present invention, in the first aspect of the invention, since the change-over between the amplification and the attenuation in the first amplifier means based on the control of control means is performed at a timing when the receiving process of input signal is not performed, no sudden fluctuation in the receiving level during signal receiving happens and an excellent signal receiving process can be achieved.

According to a third aspect of the present invention, in the first aspect of the invention, since the control means judges the level of input signal by the gain value of second amplifier means which is set by the gain-setting means and the selection between the amplification and the attenuation in the first amplifier means is performed on the basis of the judgment of control means and the detecting output of detecting means, the control process of the first amplifier means can be achieved simply and quickly only by the judgement of the gain value which is set by the gain setting means.

According to a fourth aspect of the present invention, in the first aspect of the invention, since the change-over between the amplification and the attenuation in the first amplifier means is performed by controlling the power supply to the amplifier means, the change-over between the amplification and the attenuation can be easily performed by controlling the power supply to the amplifier means.

According to a fifth aspect of the present invention, in the first aspect of the invention, when the change-over between the amplification and the attenuation in the first amplifier means is performed, the fluctuation of signal level due to the change-over is compensated for by the gain change of the second amplifier means, to thereby suppress sudden fluctuations of the signal to thereby suppress level.

According to a sixth aspect of the present invention, in the first aspect of the invention, when the detecting means detects a strong input signal and the input signal is attenuated by the first amplifier means, if the level detecting means detects that the signal level of receiving channel is less than a predetermined level, the input signal is amplified by the first amplifier means and the gain of the second amplifier means is decreased correspondingly, a strong input time due to a jamming wave being coped with appropriately.

According to a seventh aspect of the present invention, in the first aspect of the invention, when the detecting means detects a strong input signal and the input signal is attenuated by the first amplifier means, if the error rate of the data which is obtained by decoding the amplification output of the second amplifier means is worse than a predetermined rate, the input signal is amplified by the first amplifier means and also, the gain of the second amplifier means is decreased correspondingly, countermeasure for a strong input due to the jamming waves being performed appropriately based on the decoding state of received data.

According to an eighth aspect of the present invention, in the first aspect of the invention, when the change-over between the amplification and the attenuation of input signal in the first amplifier means is performed a plurality of predetermined times successively, the control means fixes the state of the first amplifier means for a certain period of time and therefore, the change-over between the amplification process and the attenuation process does not continue unstably, the receiving state becoming stable although the receiving signal of which level is near the switching point is obtained.

Having described preferred embodiments of the present invention with reference to the accompanying drawings, it is to be understood that the present invention is not limited to the above-mentioned embodiments and that various changes and modifications can be effected therein by one in the art without departing from the spirit or scope of the present invention as defined in the appended claims.

What is claimed is:

1. A receiving apparatus for receiving a desired channel signal in a predetermined communication band, comprising;
    first amplifier means for selectively carrying out an amplification and an attenuation of an input signal and for handling a signal in said communication band;
    converter means for converting said channel signal outputted from said first amplifier means into an intermediate frequency signal or a base band signal;
    second amplifier means for amplifying a signal converted by said converter means in a gain variable fashion;
    level detecting means for detecting a signal level of a receiving channel by detecting an output level of said second amplifier means;
    gain setting means for a setting a gain of said second amplifier means based on a detected output of said level detecting means;
    detector means for detecting said input signal level by detecting an output of said first amplifier means; and
    control means for selecting the amplification or the attenuation in said first amplifier means based on a detection output of said detector means;
        wherein when said detector means detects a strong input signal by its detection and said first amplifier means attenuates the input signal, if said level detecting means detects that a signal level of the receiving channel is less than a predetermined level, said first amplifier means amplifies the input signal and at the same time the gain of said second amplifier means is decreased correspondingly.

2. The apparatus of claim 1 wherein a change-over between the amplification and the attenuation in said first amplifier means based on the control of said control means is performed at a timing when the receiving process of the input signal is not performed.

3. The apparatus of claim 2 wherein said control means judges the input signal level from a gain value of said second amplifier means which is set by said gain setting means, and performs the selection of the amplification or the attenuation in said first amplifier means based on its judgement and the detection output of said detector means.

4. The apparatus of claim 3 wherein the change-over between the amplification and the attenuation in said first amplifier means is performed by controlling a power supply to said first amplifier means.

5. The apparatus of claim 4 wherein when the change-over between the amplification and the attenuation in said first amplifier means is performed, a signal level fluctuating due to the change-over is compensated for by a gain change of said second amplifier means.

6. The apparatus of claim 5 wherein when the change-over between the amplification and the attenuation of input signal in said first amplifier means is performed at a predetermined plurality of times successively, said control means fixes a state of said first amplifier means for a certain period of time.

7. The apparatus of claim 1 wherein said control means judges the input signal level from a gain value of said second amplifier means which is set by said gain setting means, and performs the selection of the amplification or the attenuation in said first amplifier means based on its judgement and the detection output of said detector means.

8. The apparatus of claim 7 wherein the change-over between the amplification and the attenuation in said first amplifier means is performed by controlling a power supply to said first amplifier means.

9. The apparatus of claim 8 wherein when the change-over between the amplification and the attenuation in said first amplifier means is performed, a signal level fluctuating due to the change-over is compensated for by a gain change of said second amplifier means.

10. The apparatus of claim 9 wherein when the change-over between the amplification and the attenuation of input signal in said first amplifier means is performed at a predetermined plurality of times successively, said control means fixes a state of said first amplifier means for a certain period of time.

11. The apparatus of claim 1 wherein the change-over between the amplification and the attenuation in said first amplifier means is performed by controlling a power supply to said first amplifier means.

12. The apparatus of claim 11 wherein when the change-over between the amplification and the attenuation in said first amplifier means is performed, a signal level fluctuating due to the change-over is compensated for by a gain change of said second amplifier means.

13. The apparatus of claim 12 wherein when the change-over between the amplification and the attenuation of input signal in said first amplifier means is performed at a predetermined plurality of times successively, said control means fixes a state of said first amplifier means for a certain period of time.

14. The apparatus of claim 1 wherein when the change-over between the amplification and the attenuation in said first amplifier means is performed, a signal level fluctuating due to the change-over is compensated for by a gain change of said second amplifier means.

15. The apparatus of claim 14 wherein when the change-over between the amplification and the attenuation of input signal in said first amplifier means is performed at a predetermined plurality of times successively, said control means fixes a state of said first amplifier means for a certain period of time.

16. The apparatus of claim 1 wherein when the change-over between the amplification and the attenuation of input signal in said first amplifier means is performed at a predetermined plurality of times successively, said control means fixes a state of said first amplifier means for a certain period of time.

17. A receiving apparatus for receiving a desired channel signal in a predetermined communication band, comprising;
- a first amplifier for selectively carrying out an amplification and an attenuation of an input signal and for handling a signal in said communication band;
- a converter for converting said channel signal outputted from said first amplifier into an intermediate frequency signal or a base band signal;
- a second amplifier for amplifying a signal converted by said converter in a gain variable fashion;
- a level detector for detecting a signal level of a receiving channel by detecting an output level of said second amplifier;
- a gain setting unit for a setting a gain of said second amplifier based on a detected output of said level detector;
- a detector for detecting said input signal level by detecting an output of said first amplifier; and
- a controller for selecting the amplification or the attenuation in said first amplifier based on a detection output of said detector;
  - wherein when said detector detects a strong input signal by its detection and said first amplifier attenuates the input signal, if said level detector detects that a signal level of the receiving channel is less than a predetermined level, said first amplifier amplifies the input signal and at the same time the gain of said second amplifier is decreased correspondingly.

18. The apparatus of claim 17 wherein a change-over between the amplification and the attenuation in said first amplifier based on the control of said controller is performed at a timing when the receiving process of the input signal is not performed.

19. The apparatus of claim 18 wherein said controller judges the input signal level from a gain value of said second amplifier which is set by said gain setting unit, and performs the selection of the amplification or the attenuation in said first amplifier based on its judgement and the detection output of said detector.

20. The apparatus of claim 19 wherein the change-over between the amplification and the attenuation in said first amplifier is performed by controlling a power supply to said first amplifier.

21. The apparatus of claim 20 wherein when the change-over between the amplification and the attenuation in said first amplifier is performed, a signal level fluctuating due to the change-over is compensated for by a gain change of said second amplifier.

22. The apparatus of claim 21 wherein when the change-over between the amplification and the attenuation of input signal in said first amplifier is performed at a predetermined plurality of times successively, said controller fixes a state of said first amplifier for a certain period of time.

23. The apparatus of claim 17 wherein said controller judges the input signal level from a gain value of said second amplifier which is set by said gain setting unit, and performs the selection of the amplification or the attenuation in said first amplifier based on its judgement and the detection output of said detector.

24. The apparatus of claim 23 wherein the change-over between the amplification and the attenuation in said first amplifier is performed by controlling a power supply to said first amplifier.

25. The apparatus of claim 24 wherein when the change-over between the amplification and the attenuation in said first amplifier is performed, a signal level fluctuating due to the change-over is compensated for by a gain change of said second amplifier.

26. The apparatus of claim 25 wherein when the change-over between the amplification and the attenuation of input signal in said first amplifier is performed at a predetermined plurality of times successively, said controller fixes a state of said first amplifier for a certain period of time.

27. The apparatus of claim 17 wherein the change-over between the amplification and the attenuation in said first amplifier is performed by controlling a power supply to said first amplifier.

28. The apparatus of claim 27 wherein when the change-over between the amplification and the attenuation in said first amplifier is performed, a signal level fluctuating due to the change-over is compensated for by a gain change of said second amplifier.

29. The apparatus of claim 28 wherein when the change-over between the amplification and the attenuation of input signal in said first amplifier is performed at a predetermined plurality of times successively, said controller fixes a state of said first amplifier for a certain period of time.

30. The apparatus of claim 17 wherein when the change-over between the amplification and the attenuation in said first amplifier is performed, a signal level fluctuating due to the change-over is compensated for by a gain change of said second amplifier.

31. The apparatus of claim 30 wherein when the change-over between the amplification and the attenuation of input signal in said first amplifier is performed at a predetermined plurality of times successively, said controller fixes a state of said first amplifier for a certain period of time.

32. The apparatus of claim 17 wherein when the change-over between the amplification and the attenuation of input signal in said first amplifier is performed at a predetermined plurality of times successively, said controller fixes a state of said first amplifier for a certain period of time.

33. A method of receiving a desired channel signal in a predetermined communication band, comprising the steps of;
- selectively carrying out an amplification and an attenuation of an input signal and for handling a signal in said communication band;
- converting said channel signal from said step of selectively carrying out amplification and attenuation into an intermediate frequency signal or a base band signal;

amplifying a signal converted at said converting step in a gain variable fashion;

first detecting step for detecting a signal level of a receiving channel by detecting an output level from said amplifying step;

setting a gain of said amplifying step based on a detected output of said first detection step;

second detecting step for detecting said input signal level by detecting an output from said step of selectively carrying out said amplification and attenuation; and selecting the amplification or the attenuation in said step of selectively carrying out said amplification and attenuation based on a detection output from said second detecting step;

wherein when a strong input signal is detected and said input signal is attenuated, if at said first detecting step a signal level of the receiving channel is detected to be less than a predetermined level, amplifying the input signal and at the same time the gain at said amplifying step is decreased correspondingly.

34. The method of claim 33 wherein a change-over between the amplification and the attenuation based on the selecting step is performed at a timing when the receiving process of the input signal is not performed.

35. The method of claim 34 wherein said selecting step judges the input signal level from a gain value of said amplifying step, and performs the selection of the amplification or the attenuation based on its judgement and the detection output of said second detecting step.

36. The method of claim 35 wherein the change-over between the amplification and the attenuation is performed by controlling a power supply.

37. The method of claim 36 wherein when the change-over between the amplification and the attenuation is performed, a signal level fluctuating due to the change-over is compensated for by a gain change at said amplifying step.

38. The method of claim 37 wherein when the change-over between the amplification and the attenuation of input signal is performed at a predetermined plurality of times successively, said selecting step fixes a state of selectively carrying out said amplification and attenuation step for a certain period of time.

39. The method of claim 33 wherein said selecting step judges the input signal level from a gain value of said amplifying step, and performs the selection of the amplification or the attenuation based on its judgement and the detection output of said second detecting step.

40. The method of claim 39 wherein the change-over between the amplification and the attenuation is performed by controlling a power supply.

41. The method of claim 40 wherein when the change-over between the amplification and the attenuation is performed, a signal level fluctuating due to the change-over is compensated for by a gain change at said amplifying step.

42. The method of claim 41 wherein when the change-over between the amplification and the attenuation of input signal is performed at a predetermined plurality of times successively, said selecting step fixes a state of selectively carrying out said amplification and attenuation step for a certain period of time.

43. The method of claim 33 wherein the change-over between the amplification and the attenuation is performed by controlling a power supply.

44. The method of claim 43 wherein when the change-over between the amplification and the attenuation is performed, a signal level fluctuating due to the change-over is compensated for by a gain change at said amplifying step.

45. The method of claim 44 wherein when the change-over between the amplification and the attenuation of input signal is performed at a predetermined plurality of times successively, said selecting step fixes a state of selectively carrying out said amplification and attenuation step for a certain period of time.

46. The method of claim 33 wherein when the change-over between the amplification and the attenuation is performed, a signal level fluctuating due to the change-over is compensated for by a gain change at said amplifying step.

47. The method of claim 46 wherein when the change-over between the amplification and the attenuation of input signal is performed at a predetermined plurality of times successively, said selecting step fixes a state of selectively carrying out said amplification and attenuation step for a certain period of time.

48. The method of claim 33 wherein when the change-over between the amplification and the attenuation of input signal is performed at a predetermined plurality of times successively, said selecting step fixes a state of selectively carrying out said amplification and attenuation step for a certain period of time.

49. A receiving apparatus for receiving a desired channel signal in a predetermined communication band, comprising;

first amplifier means for selectively carrying out an amplification and an attenuation of an input signal and for handling a signal in said communication band;

converter means for converting said channel signal outputted from said first amplifier means into an intermediate frequency signal or a base band signal;

second amplifier means for amplifying a signal converted by said converter means in a gain variable fashion;

level detecting means for detecting a signal level of a receiving channel by detecting an output level of said second amplifier means;

gain setting means for a setting a gain of said second amplifier means based on a detected output of said level detecting means;

detector means for detecting said input signal level by detecting an output of said first amplifier means; and control means for selecting the amplification or the attenuation in said first amplifier means based on a detection output of said detector means;

wherein when said detector means detects a strong input signal by its detection and said first amplifier means attenuates the input signal, if an error rate of data obtained by the decoding an amplified output of said second amplifier means is deteriorated worse than a predetermined rate, said first amplifier means amplifies the input signal and at the same time the gain of said second amplifier means is decreased correspondingly.

50. The apparatus of claim 49 wherein a change-over between the amplification and the attenuation in said first amplifier means based on the control of said control means is performed at a timing when the receiving process of the input signal is not performed.

51. The apparatus of claim 50 wherein said control means judges the input signal level from a gain value of said second amplifier means which is set by said gain setting means, and performs the selection of the amplification or the attenuation in said first amplifier means based on its judgement and the detection output of said detector means.

52. The apparatus of claim 51 wherein the change-over between the amplification and the attenuation in said first amplifier means is performed by controlling a power supply to said first amplifier means.

53. The apparatus of claim 52 wherein when the change-over between the amplification and the attenuation in said first amplifier means is performed, a signal level fluctuating due to the change-over is compensated for by a gain change of said second amplifier means.

54. The apparatus of claim 53 wherein when the change-over between the amplification and the attenuation of input signal in said first amplifier means is performed at a predetermined plurality of times successively, said control means fixes a state of said first amplifier means for a certain period of time.

55. The apparatus of claim 49 wherein said control means judges the input signal level from a gain value of said second amplifier means which is set by said gain setting means, and performs the selection of the amplification or the attenuation in said first amplifier means based on its judgement and the detection output of said detector means.

56. The apparatus of claim 55 wherein the change-over between the amplification and the attenuation in said first amplifier means is performed by controlling a power supply to said first amplifier means.

57. The apparatus of claim 56 wherein when the change-over between the amplification and the attenuation in said first amplifier means is performed, a signal level fluctuating due to the change-over is compensated for by a gain change of said second amplifier means.

58. The apparatus of claim 57 wherein when the change-over between the amplification and the attenuation of input signal in said first amplifier means is performed at a predetermined plurality of times successively, said control means fixes a state of said first amplifier means for a certain period of time.

59. The apparatus of claim 49 wherein the change-over between the amplification and the attenuation in said first amplifier means is performed by controlling a power supply to said first amplifier means.

60. The apparatus of claim 59 wherein when the change-over between the amplification and the attenuation in said first amplifier means is performed, a signal level fluctuating due to the change-over is compensated for by a gain change of said second amplifier means.

61. The apparatus of claim 60 wherein when the change-over between the amplification and the attenuation of input signal in said first amplifier means is performed at a predetermined plurality of times successively, said control means fixes a state of said first amplifier means for a certain period of time.

62. The apparatus of claim 49 wherein when the change-over between the amplification and the attenuation in said first amplifier means is performed, a signal level fluctuating due to the change-over is compensated for by a gain change of said second amplifier means.

63. The apparatus of claim 62 wherein when the change-over between the amplification and the attenuation of input signal in said first amplifier means is performed at a predetermined plurality of times successively, said control means fixes a state of said first amplifier means for a certain period of time.

64. The apparatus of claim 49 wherein when the change-over between the amplification and the attenuation of input signal in said first amplifier means is performed at a predetermined plurality of times successively, said control means fixes a state of said first amplifier means for a certain period of time.

65. A receiving apparatus for receiving a desired channel signal in a predetermined communication band, comprising;
   a first amplifier for selectively carrying out an amplification and an attenuation of an input signal and for handling a signal in said communication band;
   a converter for converting said channel signal outputted from said first amplifier into an intermediate frequency signal or a base band signal;
   a second amplifier for amplifying a signal converted by said converter in a gain variable fashion;
   a level detector for detecting a signal level of a receiving channel by detecting an output level of said second amplifier;
   a gain setting unit for a setting a gain of said second amplifier based on a detected output of said level detector;
   a detector for detecting said input signal level by detecting an output of said first amplifier; and
   a controller for selecting the amplification or the attenuation in said first amplifier based on a detection output of said detector;
      wherein when said detector detects a strong input signal by its detection and said first amplifier attenuates the input signal, if an error rate of data obtained by the decoding an amplified output of said second amplifier is deteriorated worse than a predetermined rate, said first amplifier amplifies the input signal and at the same time the gain of said second amplifier is decreased correspondingly.

66. The apparatus of claim 65 wherein a change-over between the amplification and the attenuation in said first amplifier based on the control of said controller is performed at a timing when the receiving process of the input signal is not performed.

67. The apparatus of claim 66 wherein said controller judges the input signal level from a gain value of said second amplifier which is set by said gain setting unit, and performs the selection of the amplification or the attenuation in said first amplifier based on its judgement and the detection output of said detector.

68. The apparatus of claim 67 wherein the change-over between the amplification and the attenuation in said first amplifier is performed by controlling a power supply to said first amplifier.

69. The apparatus of claim 68 wherein when the change-over between the amplification and the attenuation in said first amplifier is performed, a signal level fluctuating due to the change-over is compensated for by a gain change of said second amplifier.

70. The apparatus of claim 69 wherein when the change-over between the amplification and the attenuation of input signal in said first amplifier is performed at a predetermined plurality of times successively, said controller fixes a state of said first amplifier for a certain period of time.

71. The apparatus of claim 65 wherein said controller judges the input signal level from a gain value of said second amplifier which is set by said gain setting unit, and performs the selection of the amplification or the attenuation in said first amplifier based on its judgement and the detection output of said detector.

72. The apparatus of claim 71 wherein the change-over between the amplification and the attenuation in said first amplifier is performed by controlling a power supply to said first amplifier.

73. The apparatus of claim 72 wherein when the change-over between the amplification and the attenuation in said first amplifier is performed, a signal level fluctuating due to the change-over is compensated for by a gain change of said second amplifier.

74. The apparatus of claim 73 wherein when the change-over between the amplification and the attenuation of input signal in said first amplifier is performed at a predetermined plurality of times successively, said controller fixes a state of said first amplifier for a certain period of time.

75. The apparatus of claim 65 wherein the change-over between the amplification and the attenuation in said first amplifier is performed by controlling a power supply to said first amplifier.

76. The apparatus of claim 75 wherein when the change-over between the amplification and the attenuation in said first amplifier is performed, a signal level fluctuating due to the change-over is compensated for by a gain change of said second amplifier.

77. The apparatus of claim 76 wherein when the change-over between the amplification and the attenuation of input signal in said first amplifier is performed at a predetermined plurality of times successively, said controller fixes a state of said first amplifier for a certain period of time.

78. The apparatus of claim 65 wherein when the change-over between the amplification and the attenuation in said first amplifier is performed, a signal level fluctuating due to the change-over is compensated for by a gain change of said second amplifier.

79. The apparatus of claim 78 wherein when the change-over between the amplification and the attenuation of input signal in said first amplifier is performed at a predetermined plurality of times successively, said controller fixes a state of said first amplifier for a certain period of time.

80. The apparatus of claim 65 wherein when the change-over between the amplification and the attenuation of input signal in said first amplifier is performed at a predetermined plurality of times successively, said controller fixes a state of said first amplifier for a certain period of time.

81. A method of receiving a desired channel signal in a predetermined communication band, comprising the steps of;
   selectively carrying out an amplification and an attenuation of an input signal and for handling a signal in said communication band;
   converting said channel signal outputted from said step of selectively carrying out said amplification and attenuation into an intermediate frequency signal or a base band signal;
   amplifying a signal converted at said converting step in a gain variable fashion;
   a first detecting step for detecting a signal level of a receiving channel by detecting an output level of said amplifying step;
   setting a gain of said amplifying step based on a detected output of said first detecting step;
   a second detecting step for detecting said input signal level by detecting an output of said step of selectively carrying out said amplification and attenuation; and
   selecting the amplification or the attenuation in said step of selectively carrying out said amplification and attenuation based on a detection output of said second detecting step;
      wherein when a strong input signal is detected at said second detecting step and said input signal is attenuated, if an error rate of data obtained by the decoding an amplified output of said amplifying step is deteriorated worse than a predetermined rate, amplifying the input signal and at the same time decreasing the gain correspondingly.

82. The method of claim 81 wherein a change-over between the amplification and the attenuation based on said selecting step is performed at a timing when the receiving process of the input signal is not performed.

83. The method of claim 82 wherein said selecting step judges the input signal level from a gain value of said amplifying step, and performs the selection of the amplification or the attenuation based on its judgement and the detection output of said second detecting step.

84. The method of claim 83 wherein the change-over between the amplification and the attenuation is performed by controlling a power supply.

85. The method of claim 84 wherein when the change-over between the amplification and the attenuation is performed, a signal level fluctuating due to the change-over is compensated for by a gain change at said amplifying step.

86. The method of claim 85 wherein when the change-over between the amplification and the attenuation of input signal is performed at a predetermined plurality of times successively, said selecting step fixes a state of said step of selectively carrying out said amplification and attenuation for a certain period of time.

87. The method of claim 81 wherein said selecting step judges the input signal level from a gain value of said amplifying step, and performs the selection of the amplification or the attenuation based on its judgement and the detection output of said second detecting step.

88. The method of claim 87 wherein the change-over between the amplification and the attenuation is performed by controlling a power supply.

89. The method of claim 88 wherein when the change-over between the amplification and the attenuation is performed, a signal level fluctuating due to the change-over is compensated for by a gain change at said amplifying step.

90. The method of claim 89 wherein when the change-over between the amplification and the attenuation of input signal is performed at a predetermined plurality of times successively, said selecting step fixes a state of said step of selectively carrying out said amplification and attenuation for a certain period of time.

91. The method of claim 81 wherein the change-over between the amplification and the attenuation is performed by controlling a power supply.

92. The method of claim 91 wherein when the change-over between the amplification and the attenuation is performed, a signal level fluctuating due to the change-over is compensated for by a gain change at said amplifying step.

93. The method of claim 92 wherein when the change-over between the amplification and the attenuation of input signal is performed at a predetermined plurality of times successively, said selecting step fixes a state of said step of selectively carrying out said amplification and attenuation for a certain period of time.

94. The method of claim 81 wherein when the change-over between the amplification and the attenuation is performed, a signal level fluctuating due to the change-over is compensated for by a gain change at said amplifying step.

95. The method of claim 94 wherein when the change-over between the amplification and the attenuation of input signal is performed at a predetermined plurality of times successively, said selecting step fixes a state of said step of selectively carrying out said amplification and attenuation for a certain period of time.

96. The method of claim 81 wherein when the change-over between the amplification and the attenuation of input signal is performed at a predetermined plurality of times successively, said selecting step fixes a state of said step of selectively carrying out said amplification and attenuation for a certain period of time.

* * * * *

UNITED STATES PATENT AND TRADEMARK OFFICE
CERTIFICATE OF CORRECTION

PATENT NO. : 6,226,504 B1
DATED : May 1, 2001
INVENTOR(S) : Kotaro Takagi

It is certified that error appears in the above-identified patent and that said Letters Patent is hereby corrected as shown below:

Column 1,
Line 27, please delete "as",
Line 42, insert -- In -- between "." and "The", same line lowercase the "T" in "The",
Line 46, insert -- in -- between "However," and "the".

Column 3,
Line 24, delete "In the meanwhile" and uppercase "A" in "an",
Line 29, delete "," between "$Q_1$" and "is",
Line 59, insert -- nature -- between "high" and ",",
Line 60, change "interupted" to -- interrupted --.

Column 4,
Line 40, insert "a" between "to" and "predetermined".

Column 5,
Line 11, change "judgment" to -- judgement --,
Line 21, delete "one of".

Column 6,
Line 4, insert -- and -- between "28" and "is",
Line 44, insert a space between "minutes)" and "(step 108)".

Column 7,
Line 40, delete "it",
Line 62, insert -- the -- between "of" and "receiving".

Column 8,
Line 2, insert -- , -- between "processed" and "resulting",
Line 16, delete "the".

Column 9,
Line 14, insert space between "27" and "34",
Line 55, delete "date" and insert -- data --,
Line 57, delete "the",
Line 59, insert space between "44I," and "44Q".

UNITED STATES PATENT AND TRADEMARK OFFICE
CERTIFICATE OF CORRECTION

PATENT NO. : 6,226,504
DATED : May 1, 2001
INVENTOR(S) : Kotaro Takagi

It is certified that error appears in the above-identified patent and that said Letters Patent is hereby corrected as shown below:

Column 10,
Lines 16 and 18, insert space between "41I," and "41Q",
Lines 26, insert space between "45I," and "45Q".

Column 11,
Line 2, change "judgement" to -- judgment --,
Line 51, insert -- skilled -- between "one" and "in".

Column 12,
Line 4, delete "said" and insert -- an --,
Lines 24 and 45, change "judgement" to -- judgment --.

Column 13,
Line 41, delete "said" and insert -- an --,
Line 62, change "judgement" to -- judgment --.

Column 14,
Line 14, change "judgement" to -- judgment --.

Column 15,
Line 8, delete "said" and insert -- an --,
Lines 26 and 44, change "judgement" to -- judgment --.

Column 16,
Line 47, delete "said" and insert -- an --,
Line 60, change "judgement" to -- judgment --.

Column 17,
Line 14, change "judgement" to -- judgment --.

UNITED STATES PATENT AND TRADEMARK OFFICE
CERTIFICATE OF CORRECTION

PATENT NO. : 6,226,504
DATED : May 1, 2001
INVENTOR(S) : Kotaro Takagi

It is certified that error appears in the above-identified patent and that said Letters Patent is hereby corrected as shown below:

Column 18,
Line 11, delete "said" and insert -- an --,
Line 32, change "judgement" to -- judgment --.

Column 19,
Line 47, delete "said" and insert -- an --.

Column 20,
Line 2, change "judgement" to -- judgment --.

Signed and Sealed this

Eleventh Day of December, 2001

Attest:

*Attesting Officer*

NICHOLAS P. GODICI
*Acting Director of the United States Patent and Trademark Office*